(12) United States Patent
Sarraf et al.

(10) Patent No.: US 6,883,594 B2
(45) Date of Patent: Apr. 26, 2005

(54) COOLING SYSTEM FOR ELECTRONICS WITH IMPROVED THERMAL INTERFACE

(75) Inventors: David B. Sarraf, Elizabethtown, PA (US); Robert E. DeHoff, Mt. Joy, PA (US); John Hartenstine, Landisville, PA (US); John J. Todd, Jr., Elizabethtown, PA (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 10/649,454

(22) Filed: Aug. 26, 2003

(65) Prior Publication Data

US 2004/0070933 A1 Apr. 15, 2004

Related U.S. Application Data

(62) Division of application No. 09/998,706, filed on Nov. 30, 2000, now abandoned.

(51) Int. Cl.[7] .............................................. F28D 15/00
(52) U.S. Cl. ............................. 165/104.33; 165/80.3; 165/104.26; 165/185; 361/687; 361/699; 361/700; 257/714; 257/715; 257/716; 174/15.2
(58) Field of Search ................... 165/104.26, 104.33, 165/185; 361/699, 700; 257/714, 715, 716; 174/15.2

(56) References Cited

U.S. PATENT DOCUMENTS

| | | | |
|---|---|---|---|
| 4,204,246 A | * | 5/1980 | Arii et al. ................ 361/699 |
| 4,912,548 A | | 3/1990 | Shanker et al. |
| 5,029,389 A | | 7/1991 | Tanzer |
| 5,095,404 A | * | 3/1992 | Chao ....................... 361/700 |
| 5,339,214 A | * | 8/1994 | Nelson ..................... 361/695 |
| 5,549,155 A | * | 8/1996 | Meyer et al. .......... 165/104.33 |
| 5,826,645 A | * | 10/1998 | Meyer et al. .......... 165/104.33 |
| 5,884,693 A | | 3/1999 | Austin et al. |
| 5,890,371 A | | 4/1999 | Rajasubramanian et al. |
| 5,946,187 A | | 8/1999 | Cipolla |
| 5,966,286 A | | 10/1999 | O'Connor et al. |
| 5,992,155 A | | 11/1999 | Kobayashi et al. |
| 6,006,827 A | | 12/1999 | Lu |
| 6,031,716 A | | 2/2000 | Cipolla et al. |
| 6,069,791 A | | 5/2000 | Goto et al. |
| 6,076,595 A | | 6/2000 | Austin et al. |
| 6,084,178 A | | 7/2000 | Cromwell |
| 6,094,344 A | | 7/2000 | Nakagawa et al. |
| 6,122,166 A | | 9/2000 | Mochizuki et al. |
| 6,122,167 A | | 9/2000 | Smith et al. |
| 6,125,035 A | * | 9/2000 | Hood et al. ............... 361/687 |
| 6,141,215 A | | 10/2000 | Podwalny et al. |
| 6,148,906 A | | 11/2000 | Li et al. |
| 6,152,213 A | | 11/2000 | Suzuki |
| 6,301,107 B1 | * | 10/2001 | Lev et al. ................. 361/687 |
| 6,328,097 B1 | * | 12/2001 | Bookhardt et al. ..... 165/104.33 |
| 6,347,036 B1 | * | 2/2002 | Yeager et al. ............. 361/687 |
| 6,352,103 B1 | * | 3/2002 | Chu et al. ................. 165/80.3 |
| 6,359,780 B1 | * | 3/2002 | McMahan et al. ........ 361/687 |
| 6,373,700 B1 | * | 4/2002 | Wang ....................... 361/698 |
| 6,400,565 B1 | * | 6/2002 | Shabbir et al. ............ 361/687 |
| 6,504,720 B1 | * | 1/2003 | Furuya .................... 361/699 |
| 6,650,540 B1 | * | 11/2003 | Ishikawa .................. 361/695 |
| 6,695,041 B1 | * | 2/2004 | Lai et al. ............... 165/104.33 |
| 6,708,754 B1 | * | 3/2004 | Wei ........................... 165/46 |
| 6,732,786 B1 | * | 5/2004 | Lee .......................... 165/80.3 |
| 6,752,201 B1 | * | 6/2004 | Cipolla et al. ............. 165/121 |
| D494,549 S | * | 8/2004 | Lee .......................... D13/179 |
| 6,830,098 B1 | * | 12/2004 | Todd et al. ............ 165/104.33 |
| 2003/0019607 A1 | * | 1/2003 | Wei ........................... 165/46 |

* cited by examiner

Primary Examiner—Henry Bennett
Assistant Examiner—Nihir Patel
(74) Attorney, Agent, or Firm—Duane Morris LLP (57) ABSTRACT

A heat pipe system including a heat transfer block and a heat pipe coupled to the heat transfer block by a clip. By utilizing a clip to couple the heat pipe to the heat transfer block, a higher degree of thermal coupling may be achieved, thereby allowing more heat to be transferred from the heat transfer block to the heat pipe. The heat pipe system has particular application in transferring heat away from heat-producing electronic components, such as computer chips.

33 Claims, 8 Drawing Sheets

COOLING SYSTEM FOR ELECTRONICS WITH IMPROVED THERMAL INTERFACE

This application is a divisional application of U.S. application Ser. No. 09/998,706, filed on Nov. 30, 2001 now abandoned.

FIELD OF THE INVENTION

The present invention relates to a method and apparatus for a heat pipe system for removing heat from electronic equipment, and in particular, a heat pipe system for removing heat from a laptop computer.

DESCRIPTION OF THE RELATED ART

A basic heat pipe comprises a closed or sealed envelope or a chamber containing an isotropic liquid-transporting wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber defined as a condenser section. The vapor is condensed in the condenser section and returned through the liquid-transporting wick to the evaporator section by capillary pumping action.

Because it operates on the principle of phase changes rather than on the principles of conduction or convection, a heat pipe is theoretically capable of transferring heat at a much higher rate than conventional heat transfer systems. Consequently, heat pipes have been utilized to cool various types of high heat-producing apparatus, such as electronic equipment (See, e.g., U.S. Pat. Nos. 5,884,693, 5,890,371, and 6,076,595).

Heat pipe assemblies are often used to remove heat from the Central Processing Unit (CPU) and other high power chips in computers. Maintenance of a good contact between the CPU (or other chip) and the heat pipe assembly is essential for insuring good overall heat transfer.

Some conventional heat pipe assemblies create a contact between the CPU (or other chip) and a portion of the heat pipe through a heat transfer plate. Such heat transfer plates are disposed either above or below the CPU or chip, and are typically centered on the CPU or chip by guide members on the heat transfer plate which interface with guide members on the CPU or chip.

Figure 1:
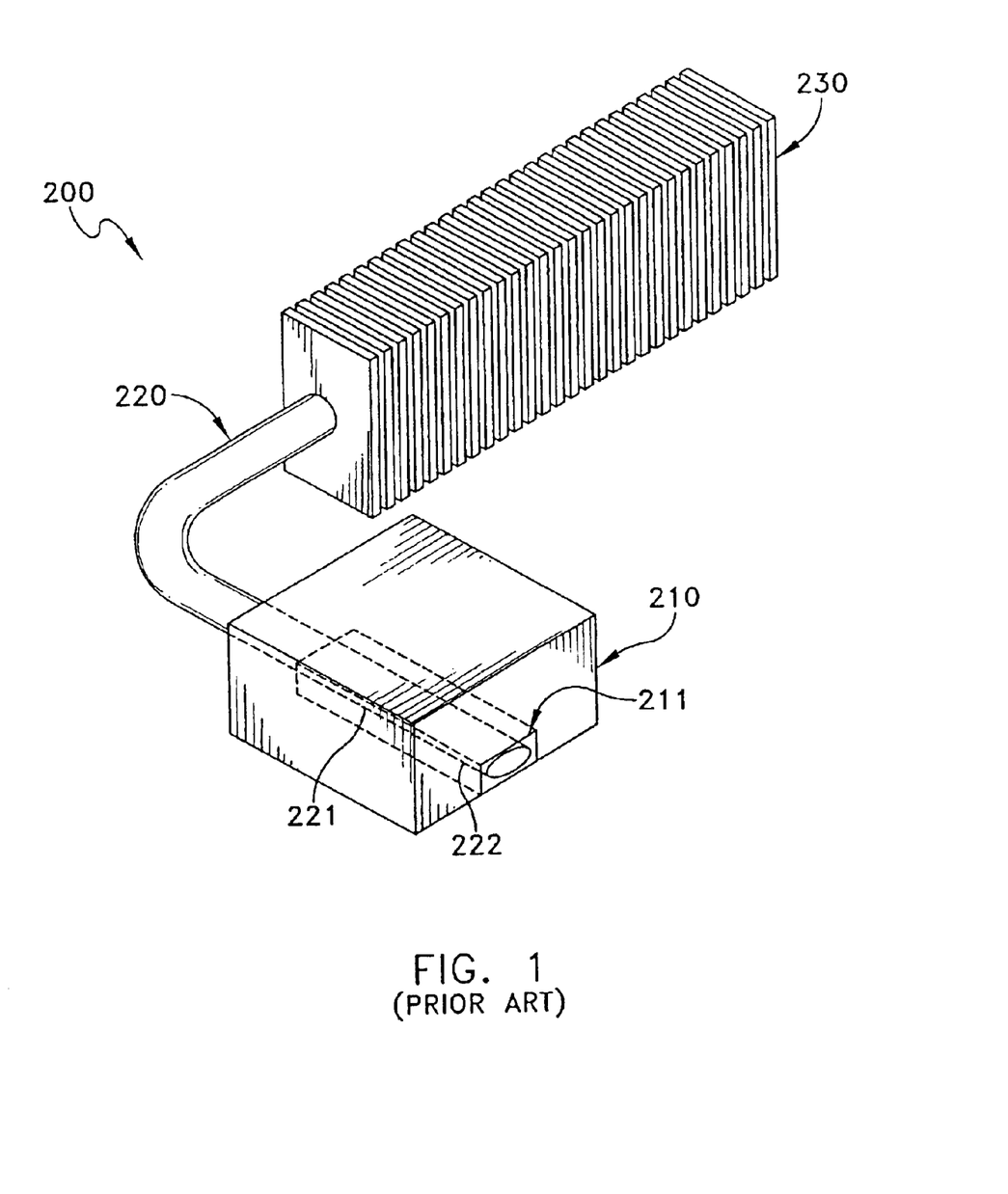
FIG. 1 is a perspective view showing a conventional heat pipe system.

Most conventional heat transfer plates comprises metal blocks with at least one tunnel or recess therein for receiving a flattened end of the associated heat pipe. FIG. 1 shows such a conventional heat pipe system 200. The heat pipe system 200 includes a heat transfer block 210, a heat pipe 220, and a heat dissipation structure 230. In a typical environment, such heat pipe system 200 would be disposed in proximity to a heat-producing apparatus (e.g. CPU, chip, etc.), such that the heat transfer block 210 would be in direct contact with the heat-producing apparatus. The heat transfer block 210 includes a tunnel 211 therein for receiving a flattened portion 221 of the heat pipe 220. The heat pipe 220 also includes a crimped end or 'pinchoff' portion 222 disposed at one end of the flattened portion 221. An end of the heat pipe 220 opposite the flattened portion 221 is coupled to the heat dissipation structure 230 (e.g., fin block). During manufacture of the heat pipe system shown in FIG. 1, the flattened portion 221 of the heat pipe 220 is inserted into the tunnel 211 in the heat transfer block 210, and is secured therein.

Since this tunnel 211 in the heat transfer block 210 must be made large enough to receive the flattened end 221 of the heat pipe 220, and the pinchoff portion 222 of the heat pipe, the tunnel must be made at least as wide as the pinchoff. Since the pinchoff 222 is almost always wider than the flattened portion 221 of the heat pipe 220, the flattened portion of the heat pipe does not fit snugly in the tunnel 211, and thus, a poor heat contact is created between the flattened portion of the heat pipe and the heat transfer block 210. Due to the poor heat contact between the flattened portion of the heat pipe 220 and the heat transfer block 210, maximum heat cannot be transferred from the CPU or chip to the heat pipe through the heat transfer plate.

Therefore, there is currently a need for a heat pipe system for effectively transferring maximum heat from a CPU (or other chip) to a heat pipe assembly in a computer.

SUMMARY OF THE INVENTION

The present invention is a heat pipe system including a heat transfer block and a heat pipe coupled to the heat transfer block by a clip.

The above and other advantages and features of the present invention will be better understood from the following detailed description of the exemplary embodiments of the invention which is provided in connection with the accompanying drawings.

DETAILED DESCRIPTION

The present invention comprises an improved apparatus and method for transferring heat from a heat-producing electronic equipment (e.g., CPU or other computer chip) to a heat pipe through the use of a heat transfer plate. By attaching the heat pipe to the heat transfer plate through a clip placed in the center of the heat transfer plate, maximum heat transfer from the heat transfer plate to the heat pipe can be achieved.

Figure 2:
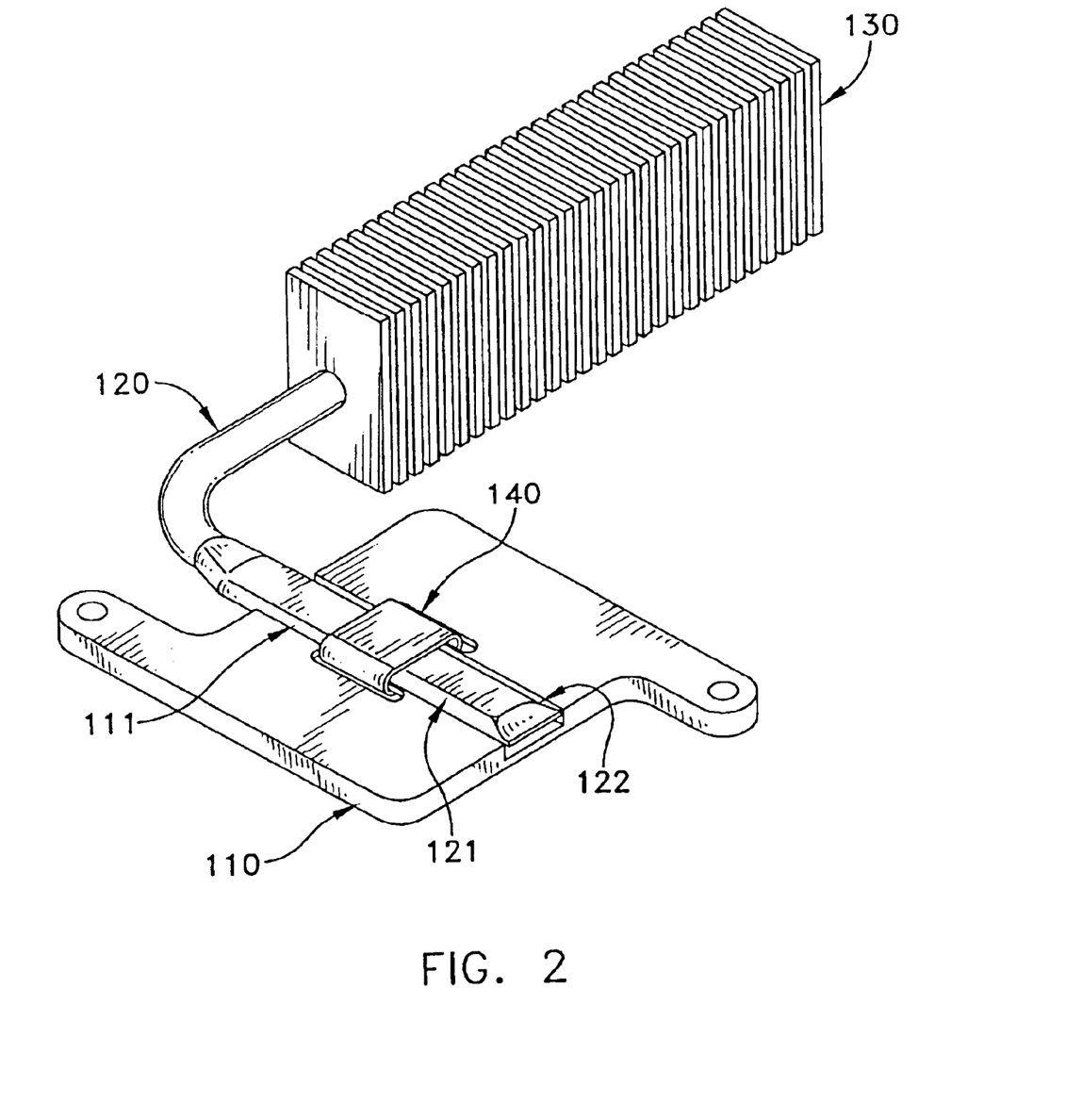
FIG. 2 is a perspective view showing a heat pipe system according to a first exemplary embodiment of the present invention.

Referring to FIG. 2, there is shown a heat pipe system 100 according to a first exemplary embodiment of the present invention. The heat pipe system 100 comprises a heat transfer block 110, a heat pipe 120, and a heat dissipation structure 130.

The heat transfer block 110 includes a channel 111 therein for receiving a flattened portion 121 of the heat pipe 120.

The heat pipe 120 also includes a pinchoff portion 122 disposed at one end of the flattened portion 121. An end of the heat pipe 120 opposite the flattened portion 121 is coupled to the heat dissipation structure 130 (e.g., fin block). One end of the channel 111 of the heat transfer block 110 has a flared portion 112 for receiving the pinchoff portion 122 of the heat pipe 120. A clip member 140 overlies and secures the flattened portion 121 of the heat pipe 120 in the channel 111. It will be noted that the clip member 140 includes a main surface 141, and two side surfaces 142, 143 disposed orthogonal to the main surface. The main surface 141 primarily overlies the flattened portion 121 of the heat pipe 120, and the two side surfaces 142, 143 primarily reside in clip channels 113, when the clip 140 is coupled to the heat transfer block 110.

Figure 3:
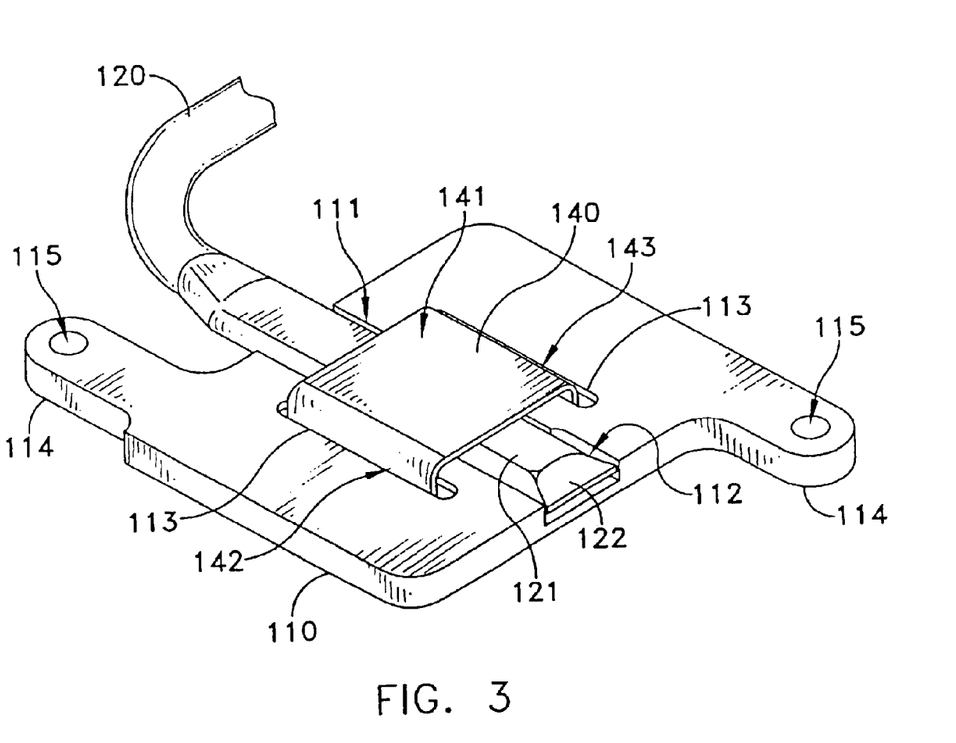
FIG. 3 is a perspective view showing a magnified version of the heat pipe system shown in FIG. 2.

FIG. 3 shows an enlarged view of the heat pipe 120 and heat transfer block 110 of the heat pipe system 100 according to the first exemplary embodiment of the present invention. It will be noted that the flattened portion 121 of the heat pipe is secured in the channel 111 of the heat transfer block 110 by the clip member 140.

FIG. 3 explicitly shows that the two side surfaces 142, 143 of the clip are received in clip channels 113 formed in the heat transfer block 110. It will be noted that although the clip channels 113 are formed as channels of a specific length which is less then the length of the transfer block 110, the clip channels may also be formed as full-length channels, such as channel 111. As will be understood by those skilled in the art, forming the clip channels 113 as full-length channels may reduce the expense of producing the heat transfer block 110 by allowing the transfer block to be formed completely by extrusion processes. The flattened portion 121 of the heat pipe 120 and the clip 140 may be secured in the channel 111 and the clip channels 113 respectively by fasteners (e.g., screws, bolts, stakes, rivets, etc.), solder, epoxy or other known materials.

Alternatively, the flattened portion 121 of the heat pipe 120 and the clip 140 may be secured in the channel 111 and the clip channels 113 by the surface friction of the flattened portion and the clip 140 against the walls of the channel 111 and the clip channels 113. In order to accomplish a tight friction contact between the channel 111 and the flattened portion 121 of the heat pipe 120, the channel is made only slightly wider than the flattened portion, so that the flattened portion fits snugly in the channels. To effect a tight friction contact between the clip 140 and the clip channels 113, the side surfaces 142, 143 of the clip are splayed out (i.e., away from the main surface) slightly, so that the side surfaces of the clip are urged against the clip channel walls when the clip is disposed in the heat transfer block 110.

The heat transfer block 110 also includes guide members 114 with openings 115 formed therein for securing the heat transfer block to a CPU or chip. Typically, a CPU or chip will include complementary guide members, such as posts, which may be received in the openings 115 in order to secure the heat transfer block 110 to the CPU or chip.

The above-described heat pipe system 100 may be formed by various methods. For example, the heat transfer block 110 may be formed as a single substantially uniform part which is later milled to create the heat pipe channel 111 and clip channels 113. Once the milled part has been manufactured, the heat pipe 120 and clip 140 may be bonded to the heat transfer block 110 by the methods discussed above (e.g., solder, epoxy, friction, fasteners), or by other means known to those skilled in the art. Alternatively, the heat transfer block 110 may be formed with the heat pipe channel 111 and the clip channels 113 already formed therein, by a process such as extrusion.

Since, in the present invention, the flattened portion 121 of the heat pipe 120 fits tightly within the channel 111 in the heat transfer block 110, and is further secured using clip 140, maximum heat transfer from the heat transfer block to the heat pipe can be achieved. As explained above, in conventional heat pipe systems such maximum heat transfer could not be realized due to the fact that the flattened portion of the heat pipe did not fit snugly within the channel (See FIG. 1). Thus, the present invention it is submitted that the present invention represents a significant advance in heat transfer technology.

Figure 4:
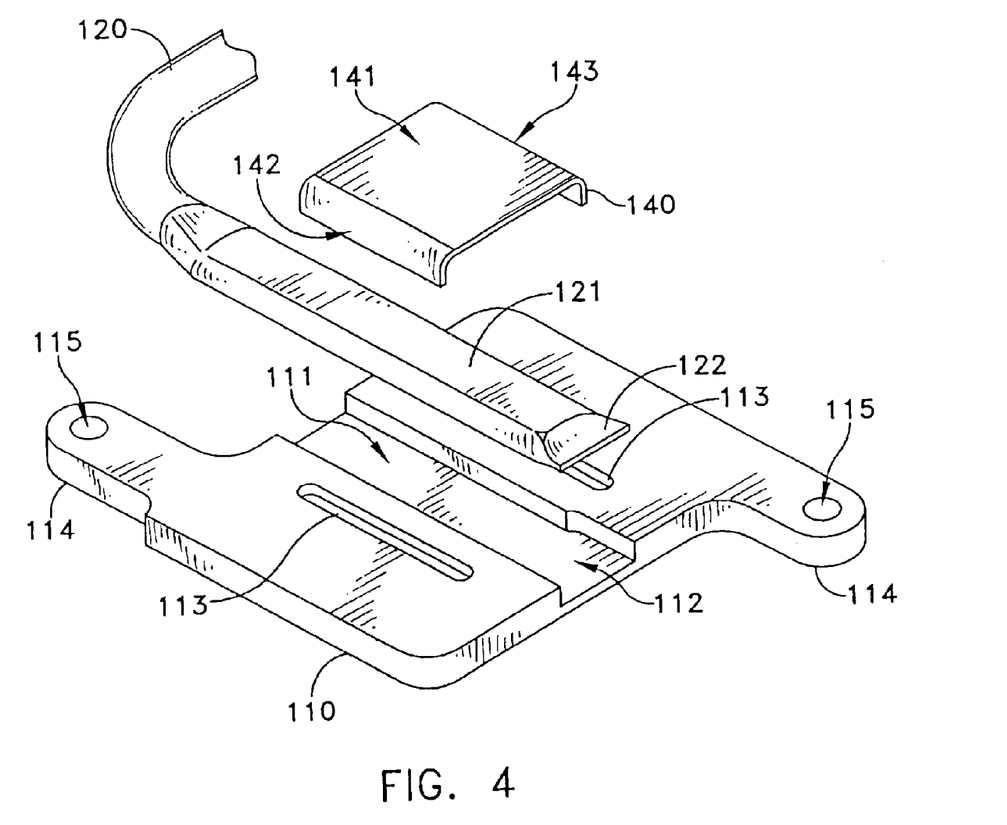
FIG. 4 is a perspective view showing an exploded and magnified version of the heat pipe system shown in FIG. 2.

FIG. 4 shows an enlarged and exploded view of the heat pipe 120 and heat transfer block 110 of the heat pipe system 100 according to the first exemplary embodiment of the present invention. FIG. 4 clearly shows that the channel 111 includes a flared portion 112 which is wider than the rest of the channel. As stated above, this flared portion 112 operates to receive the pinchoff portion 122 of the heat pipe 120. FIG. 4 also clearly shows the clip channels 113. Although the clip channels 113 are oval-shaped in FIG. 4, it will be understood that these channels may take various geometrical shapes (e.g., rectangles, etc.).

One of the main reasons for utilizing the channel structure 111 described above is to provide a means of applying downward pressure on the heat transfer block 110. The downward pressure must be applied at the physical center of the CPU or chip to which the transfer block 110 is coupled to assure that the transfer block is seated squarely on the CPU or chip without creating a gap therebetween. Often times when the transfer block 110 is not seated squarely on the CPU or chip a wedge-shaped gap is formed between the transfer block and the CPU or chip. Such a gap could result in poor thermal contact between the CPU or chip and the transfer block 110, and could, in the case of a CPU having an exposed silicon die, cause cracking or splaying from the edges of the die, and subsequently reduce heat transfer area or cause electrical malfunction. The downward pressure cannot be applied through the wall of the heat pipe because the wall is often made of a thin metal (e.g., Copper) sheet which does not have sufficient tensile strength to transfer the force without deformation of the metal. Such deformation may result in diminution of the contact pressure, and reduction in heat pipe performance due to the local reduction in vapor flow area. The channel structure 111 is designed to circumvent the deformation problem, while allowing pressure to be applied at the center of the CPU or chip to which the transfer block 110 is coupled.

Additionally, in the first exemplary embodiment described above, the heat pipe 120 is disposed at the physical center of the CPU or chip, the region of maximum heat production. Location of the heat pipe 120 in this region produces a heat pipe system 100 with a low thermal resistance.

Figure 5:
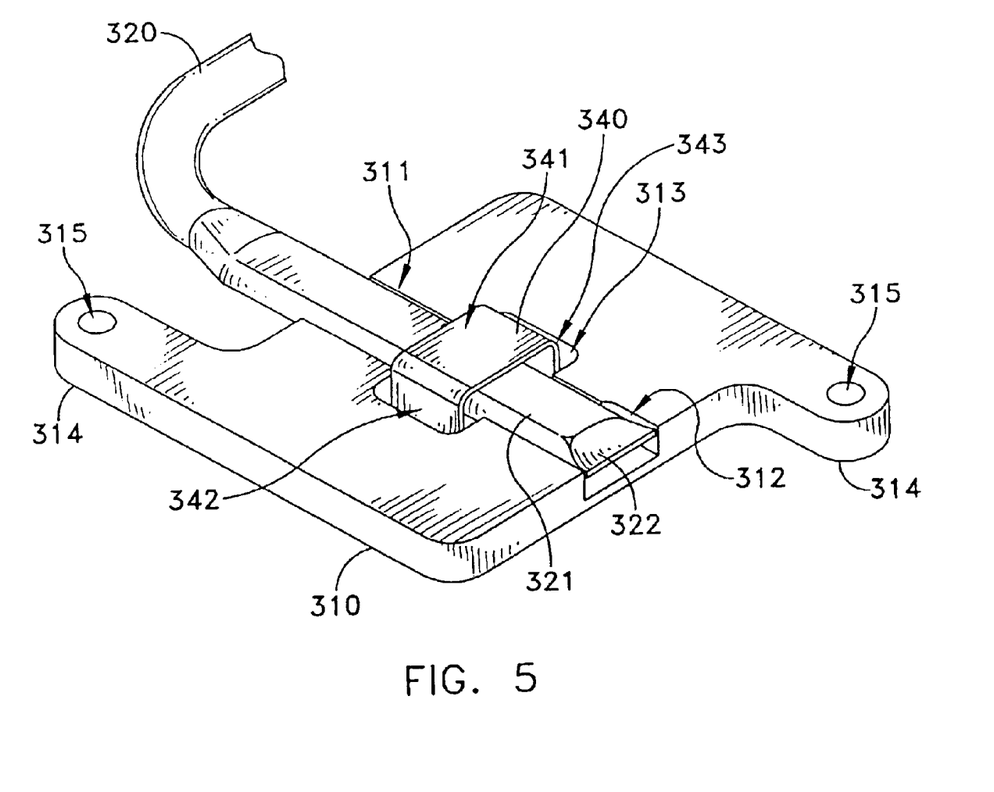
FIG. 5 is a perspective view showing a heat pipe system according to a second exemplary embodiment of the present invention.
Figure 6:
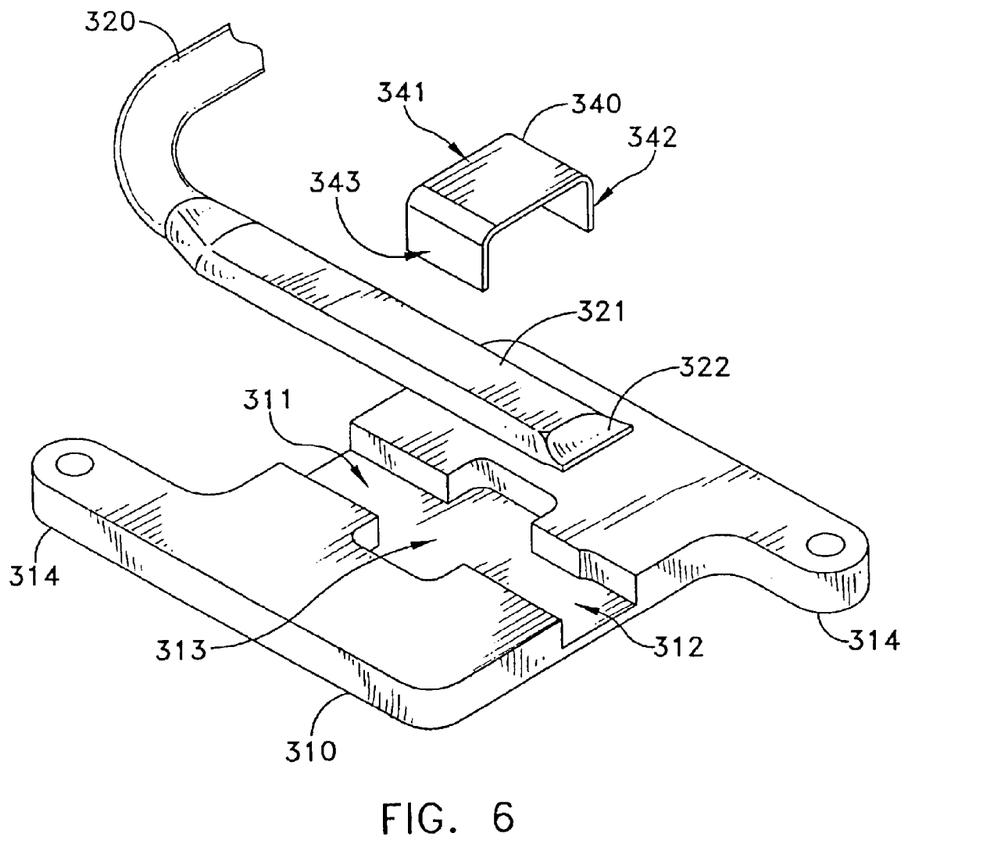
FIG. 6 is a perspective view showing an exploded version of the heat pipe system shown in FIG. 5.

Referring to FIG. 5, there is shown a heat pipe system 300 according to a second exemplary embodiment of the present invention. Similar to the heat pipe system 100, the heat pipe system 300 includes a heat transfer block 310, a heat pipe 320, and a heat dissipation structure (not shown). However, the heat pipe system 300 includes only a single clip channel 313 for receiving a clip 340.

FIG. 5 shows that the heat transfer block 310 includes a channel 311 therein for receiving a flattened portion 321 of the heat pipe 320. The heat pipe 320 also includes a pinchoff portion 322 disposed at one end of the flattened portion 321.

An end of the heat pipe 320 opposite the flattened portion 321 is coupled to the heat dissipation structure not shown). One end of the channel 311 of the heat transfer block 310 has a flared portion 312 for receiving the pinchoff portion 322 of the heat pipe 320. A clip member 340 overlies and secures the flattened portion 321 of the heat pipe 320 in the channel 311. It will be noted that the clip member 340 includes a main surface 341, and two side surfaces 342, 343 disposed orthogonal to the main surface. The main surface 341 primarily overlies the flattened portion 321 of the heat pipe 320, and the two side surfaces 342, 343 primarily reside in single clip channel 313, when the clip 340 is coupled to the heat transfer block 310.

It will be noted that the two side surfaces 342, 343 of the clip are received in a single clip channel 313 formed in the heat transfer block 310. The flattened portion 321 of the heat pipe 320 and the clip 340 may be secured in the channel 311 and the single clip channel 313 respectively by fasteners (e.g., screws, bolts, etc.), solder, epoxy or other known materials.

Alternatively, the flattened portion 321 of the heat pipe 320 and the clip 340 may be secured in the channel 311 and the single clip channel 313 by the surface friction of the flattened portion and the clip 340 against the walls of the channel 311 and the single clip channel 313. As stated above with respect to the first exemplary embodiment, in order to accomplish a tight friction contact between the channel 311 and the flattened portion 321 of the heat pipe 320, the channel is made only slightly wider than the flattened portion, so that the flattened portion fits snugly in the channels. To effect a tight friction contact between the clip 340 and the single clip channel 313, the side surfaces 342, 343 of the clip are splayed out (i.e., away from the main surface) slightly, so that the side surfaces of the clip are urged against the clip channel walls when the clip is disposed in the heat transfer block 310.

The heat transfer block 310 also includes guide members 314 with openings 315 formed therein for securing the heat transfer block to a CPU or chip. Typically, a CPU or chip will include complementary guide members, such as posts, which may be received in the openings 315 in order to secure the heat transfer block 310 to the CPU or chip.

As described above with reference to the heat pipe system 100 of the first exemplary embodiment, the heat pipe system 300 may be formed by various means such as milling and extrusion.

Figure 7:
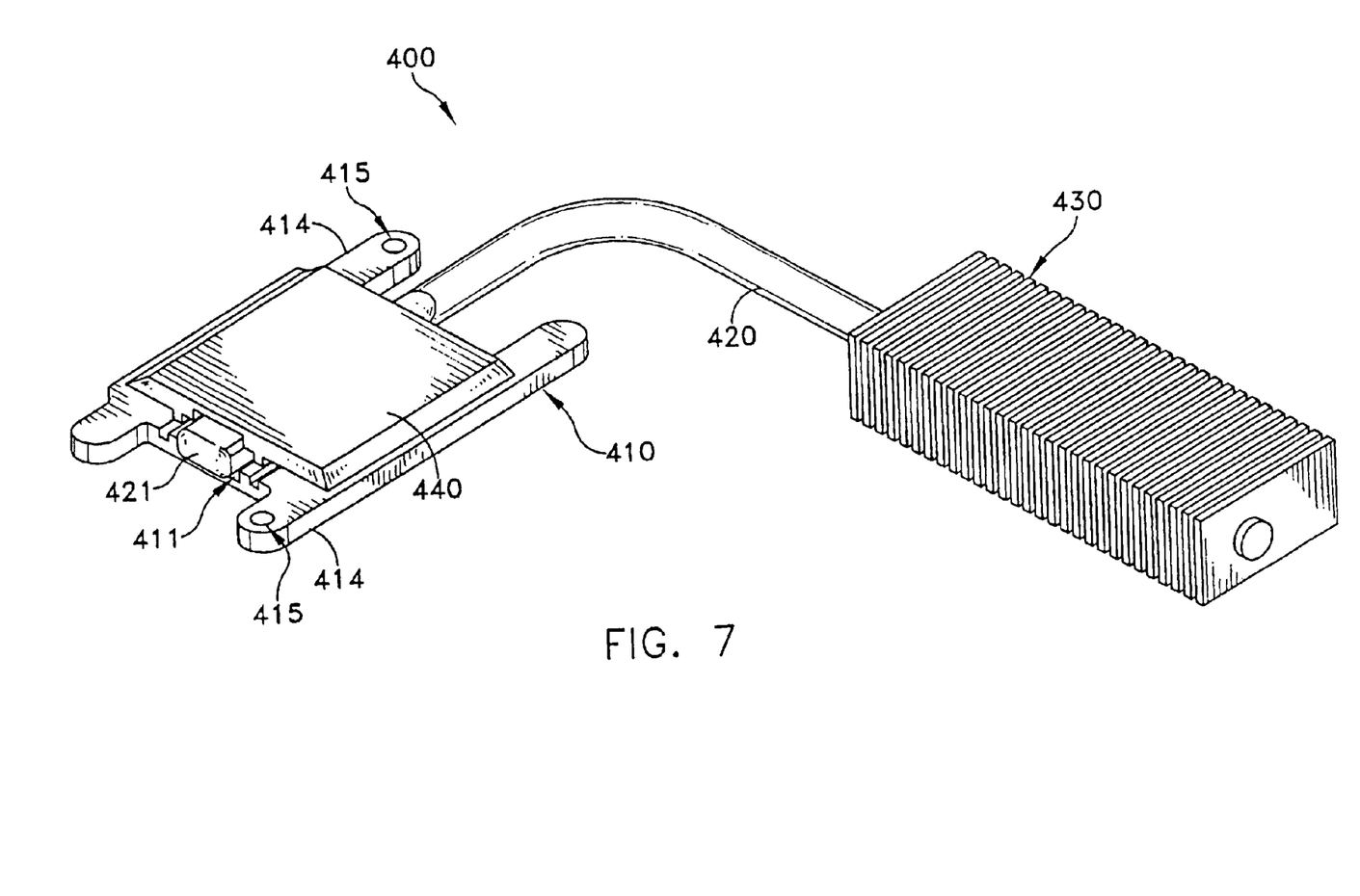
FIG. 7 is a perspective view showing a heat pipe system according to a third exemplary embodiment of the present invention.
Figure 8:
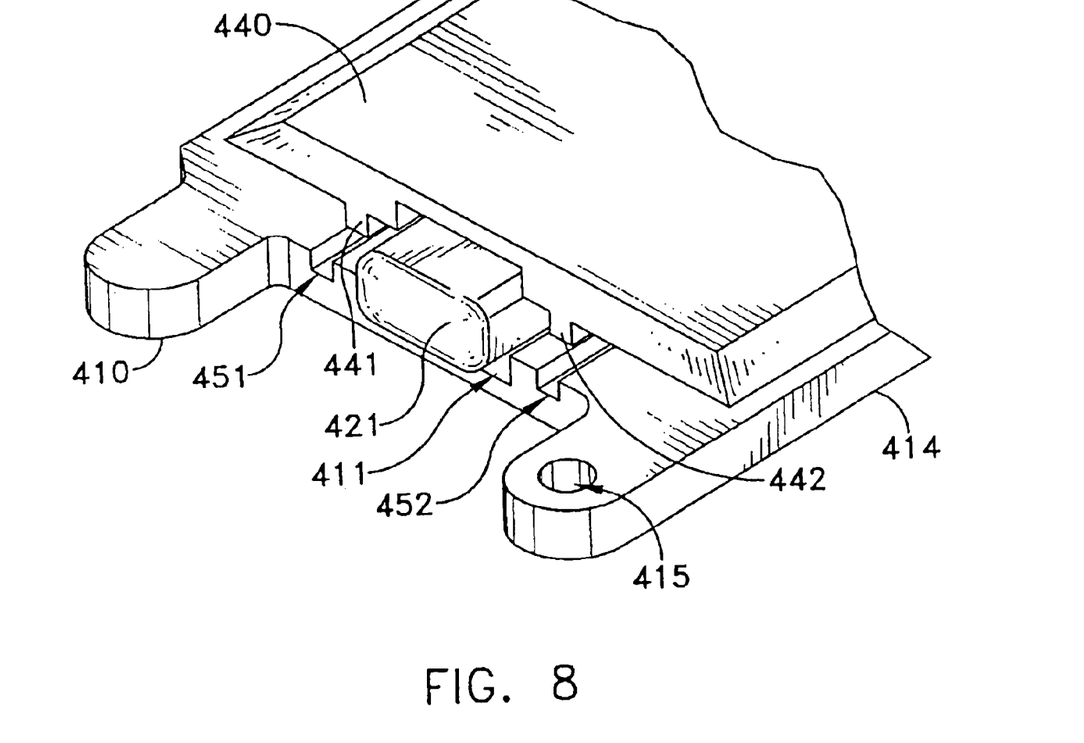
FIG. 8 is a perspective view showing an enlarged of the heat pipe system shown in FIG. 7.

Referring to FIGS. 7 and 8, there is shown a heat pipe system 400 according to a second exemplary embodiment of the present invention. Similar to the heat pipe system 100, the heat pipe system 400 includes a heat transfer block 410, a heat pipe 420, and a heat dissipation structure 430. However, the heat pipe system 400 includes a flattened clip member 440 which extends across the heat transfer block 410 with tabs 441, 442 formed therein for being received in respective channels 451, 452 of the heat transfer block (See FIG. 8).

FIG. 7 shows that the heat transfer block includes a channel 411 therein for receiving a flattened portion 421 of the heat pipe 420. A clip member 440 overlies and secures the flattened portion 421 of the heat pipe 420 in the channel 411. It will be noted that the clip member 440 includes a top surface 445, and a bottom surface 446 with tabs 441, 442 extending orthogonally therefrom (See FIG. 8).

The flattened portion 421 of the heat pipe 420 and the clip 440 may be secured in the channel 411 and the clip channels 451, 452 respectively by fasteners (e.g., screws, bolts, etc.), solder, epoxy or other known materials.

Alternatively, the flattened portion 421 of the heat pipe 420 and the clip 440 may be secured in the channel 411 and the clip channels 451, 452 by the surface friction of the flattened portion and the clip 440 against the walls of the channel 411 and the clip channels 451, 452. As stated above with respect to the first exemplary embodiment, in order to accomplish a tight friction contact between the channel 411 and the flattened portion 421 of the heat pipe 420, the channel is made only slightly wider than the flattened portion, so that the flattened portion fits snugly in the channels. Similarly, to effect a tight friction contact between the clip 440 and the clip channels 451, 452, the channels are made only slightly wider than the respective tabs 441, 442.

The heat transfer block 410 also includes guide members 414 with openings 415 formed therein for securing the heat transfer block to a CPU or chip. Typically, a CPU or chip will include complementary guide members, such as posts, which may be received in the openings 415 in order to secure the heat transfer block 410 to the CPU or chip.

As described above with reference to the heat pipe system 100 of the first exemplary embodiment, the heat pipe system 400 may be formed by various means such as milling and extrusion.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A heat pipe system comprising:
   a heat transfer block including at least two clip channels that are defined in spaced relation to one another through a central portion of said heat transfer block; and,
   a heat pipe coupled to the heat transfer block by a flattened planar clip having (i) a central channel defined in a bottom surface that is sized to receive a portion of said heat pipe and (ii) spaced apart tabs that protect outwardly from said bottom surface of said flattened clip adjacent to sides of said central channel so that said spaced apart tabs are received in said at least two clip channels.

2. The heat pipe system of claim 1, wherein the clip includes a main surface and two side surfaces disposed substantially orthogonal to the main surface.

3. The heat pipe system of claim 1, wherein the heat transfer block includes at least one heat pipe channel disposed therein between said at least two clip channels for receiving the heat pipe.

4. The heat pipe system of claim 3, wherein the heat pipe includes a main portion and a pinchoff portion, wherein the pinchoff portion is disposed in the heat pipe channel.

5. The heat pipe system of claim 3, wherein the heat pipe is coupled to the heat pipe channel by solder.

6. The heat pipe system of claim 3, wherein the heat pipe is coupled to the heat pipe channel by epoxy.

7. The heat pipe system of claim 3, wherein the heat pipe is coupled to the heat pipe channel by friction.

8. The heat pipe system of claim 3, wherein the heat pipe is coupled to the heat pipe channel by at least one fastener.

9. The heat pipe system of claim 2, wherein the heat transfer block includes at least one clip channel disposed therein for receiving the clip, such that the two side surfaces of the clip are disposed in the at least one clip channel.

10. The heat pipe system of claim 9, wherein the clip is coupled to the at least two clip channels by solder.

11. The heat pipe system of claim 9, wherein the clip is coupled to the at least two clip channels by epoxy.

12. The heat pipe system of claim 9, wherein the clip is coupled to the at least two clip channels by friction.

13. The heat pipe system of claim 9, wherein the heat pipe is coupled to the heat pipe channel by at least one fastener.

14. The heat pipe system of claim 2, wherein the heat transfer block includes at least two clip channels disposed therein for receiving the clip, such that the two side surfaces of the clip are disposed in the at least two clip channels.

15. The heat pipe system of claim 14, wherein the clip is coupled to the at least two clip channels by solder.

16. The heat pipe system of claim 14, wherein the clip is coupled to the at least two clip channels by epoxy.

17. The heat pipe system of claim 14, wherein the clip is coupled to the at least two clip channels by friction.

18. The heat pipe system of claim 14, wherein the heat pipe is coupled to the heat pipe channel by at least one fastener.

19. The heat pipe system of claim 1, wherein the clip includes a top surface with at least two tabs extending orthogonally from said bottom surface and spaced apart by a distance that is less than a width of said heat pipe.

20. The heat pipe system of claim 19, wherein the heat transfer block includes at least two channels for receiving the at least two tabs in the clip.

21. The heat pipe system of claim 1, wherein the clip extends substantially across an entire top surface of the heat transfer block.

22. A computer comprising:
at least one electronic component;
a heat transfer block disposed adjacent to the at least one electronic component, said heat transfer block including a central channel and at least two clip channels that are defined in spaced relation to one another and each being adjacent to said central channel; and,
a heat pipe coupled to the heat transfer block by a flattened clip having spaced apart tabs that project outwardly from a side surface so as to be received in said at least two clip channels for coupling said heat transfer block to said heat pipe.

23. A heat pipe system comprising:
a heat transfer block including a central channel and at least two clip channels that are defined in spaced relation to one another and each being adjacent to said central channel; and
a heat pipe positioned within said central channel; and
a flattened clip having spaced apart tabs that project outwardly from a side surface so as to be received in said at least two clip channels for coupling said heat transfer block to said heat pipe.

24. A heat pipe system comprising:
a heat transfer block including a central channel and at least two substantially parallel clip channels that are defined in spaced relation to one another and each being adjacent to said central channel; and a heat pipe having a flattened end positioned within said central channel; and
a flattened clip having spaced apart, substantially parallel tabs that project outwardly from a surface so as to be received in said at least two clip channels for coupling said heat transfer block to said flattened end of said heat pipe.

25. The heat pipe system of claim 24 wherein said flattened clip includes a bottom surface wherein said spaced apart tabs project orthogonally from said bottom surface.

26. The heat pipe system of claim 25 wherein said spaced apart tabs are coupled to said at least two clip channels by friction.

27. The heat pipe system of claim 24 wherein said flattened clip includes a main surface and two side surfaces disposed substantially orthogonal to said main surface and further wherein said heat transfer block includes at least two clip channels disposed therein for receiving a portion of said flattened clip such that said two side surfaces of said flattened clip are disposed in said at least two clip channels.

28. The heat pipe system of claim 24 wherein said flattened clip extends substantially across an entire top surface of said heat transfer block.

29. A heat pipe system comprising:
a heat transfer block including at least two clip channels that are defined in spaced relation to one another; and,
a heat pipe coupled to the heat transfer block by a flattened clip comprising (i) a central channel that is sized to receive a portion of said heat pipe and having a first side and a second side, and (ii) a first tab that projects outwardly from said first side and a second tab that projects outwardly from said second side so as to be received, respectively, in said at least two clip channels thereby coupling said heat transfer block to said heat pipe.

30. The heat pipe system of claim 29 wherein said flattened clip includes a bottom surface wherein said spaced apart tabs project orthogonally from said bottom surface and said central channel is defined in said bottom surface.

31. The heat pipe system of claim 29 wherein said spaced apart tabs are coupled to said at least two clip channels by friction.

32. The heat pipe system of claim 29 wherein said flattened clip includes a flattened main surface and two side surfaces disposed substantially orthogonal to said flattened main surface and further wherein said heat transfer block includes at least two clip channels disposed therein for receiving a portion of said flattened clip such that said two side surfaces of said flattened clip are disposed in said at least two clip channels.

33. The heat pipe system of claim 29 wherein said flattened clip extends substantially across an entire top surface of said heat transfer block.

* * * * *